United States Patent
Shum

(10) Patent No.: US 7,081,381 B2
(45) Date of Patent: Jul. 25, 2006

(54) FLASH MEMORY CELL AND THE METHOD OF MAKING SEPARATE SIDEWALL OXIDATION

(75) Inventor: Danny Shum, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 10/953,949

(22) Filed: Sep. 29, 2004

(65) Prior Publication Data

US 2005/0040474 A1    Feb. 24, 2005

Related U.S. Application Data

(62) Division of application No. 10/234,344, filed on Sep. 4, 2002, now Pat. No. 6,841,824.

(51) Int. Cl.
*H01L 21/8242* (2006.01)

(52) U.S. Cl. ............... 438/241; 438/424; 438/258; 438/261; 257/288; 257/314; 257/324; 257/326; 365/182

(58) Field of Classification Search ............... None
See application file for complete search history.

(56) References Cited

U.S. PATENT DOCUMENTS

| | | | |
|---|---|---|---|
| 5,190,887 A * | 3/1993 | Tang et al. ............ 438/264 |
| 5,313,419 A | 5/1994 | Chang |
| 5,412,238 A * | 5/1995 | Chang ............ 365/185.16 |
| 5,702,988 A | 12/1997 | Liang |
| 5,717,634 A | 2/1998 | Smayling et al. |
| 6,037,222 A | 3/2000 | Huang et al. |
| 6,043,123 A * | 3/2000 | Wang et al. ............ 438/258 |
| 6,096,597 A | 8/2000 | Tsu et al. |
| 6,141,242 A | 10/2000 | Hsu et al. |
| 6,146,970 A | 11/2000 | Witek et al. |
| 6,174,759 B1 * | 1/2001 | Verhaar et al. ............ 438/201 |
| 6,180,456 B1 | 1/2001 | Lam et al. |
| 6,207,501 B1 | 3/2001 | Hsieh et al. |
| 6,228,712 B1 | 5/2001 | Kawai et al. |
| 6,258,667 B1 | 7/2001 | Huang |
| 6,284,602 B1 | 9/2001 | He et al. |
| 6,368,907 B1 | 4/2002 | Doi et al. |
| 6,406,960 B1 | 6/2002 | Hopper et al. |
| 2002/0025635 A1 | 2/2002 | Kwon |
| 2002/0041000 A1 | 4/2002 | Watanabe |

FOREIGN PATENT DOCUMENTS

| | | |
|---|---|---|
| EP | 0 810 667 | 12/1997 |
| EP | 0 997 930 | 5/2000 |
| JP | 02-260564 | 10/1990 |

* cited by examiner

*Primary Examiner*—Nathan J. Flynn
*Assistant Examiner*—Scott R. Wilson
(74) *Attorney, Agent, or Firm*—Slater & Matsil, L.L.P.

(57) ABSTRACT

A process and product for making integrated circuits with dense logic and/or linear regions and dense memory regions is disclosed. On a common substrate, a dual hard mask process separately forms stacks of logic and/or linear transistors and EEPROM memory transistors. By using the process, the logic and/or linear and memory transistors are made with different sidewall insulating layers. The logic and/or linear transistors have relatively thin sidewall insulating layers sufficient to provide isolation from adjacent devices and conductors. The memory transistors have thicker sidewall insulating layer to prevent the charge stored in the memory device from adversely influencing the operation of the memory transistor.

16 Claims, 2 Drawing Sheets

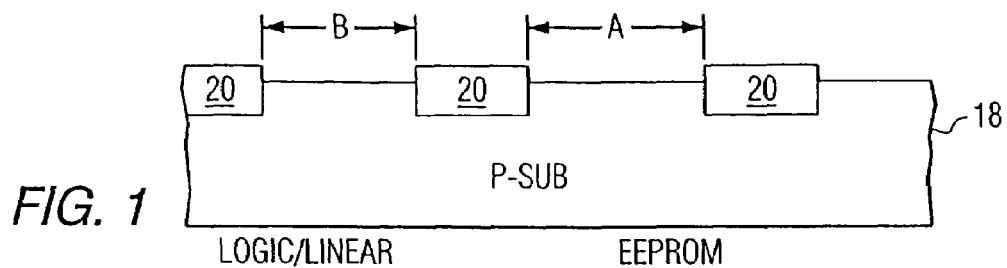
FIG. 1
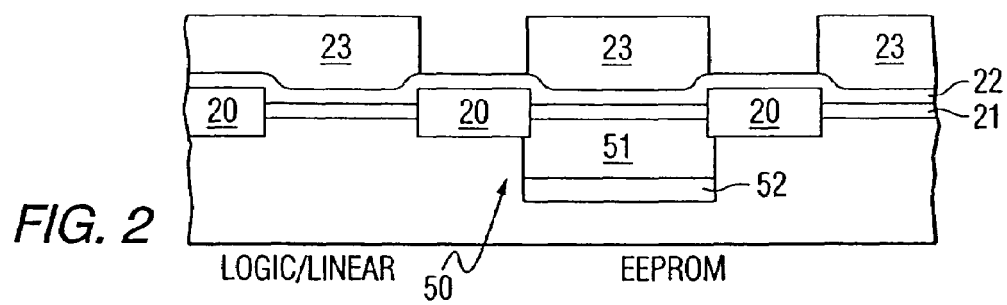
FIG. 2
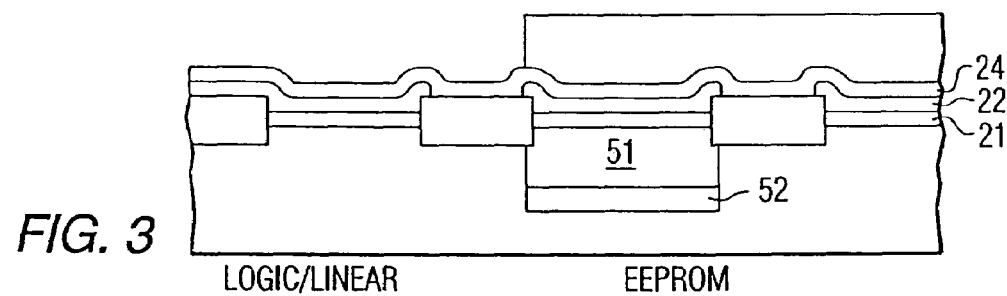
FIG. 3
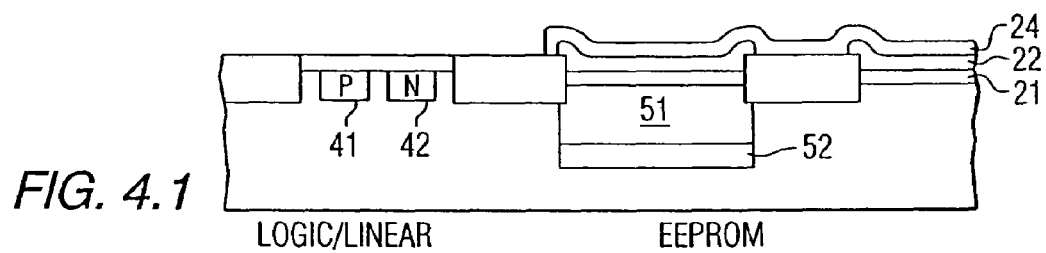
FIG. 4.1
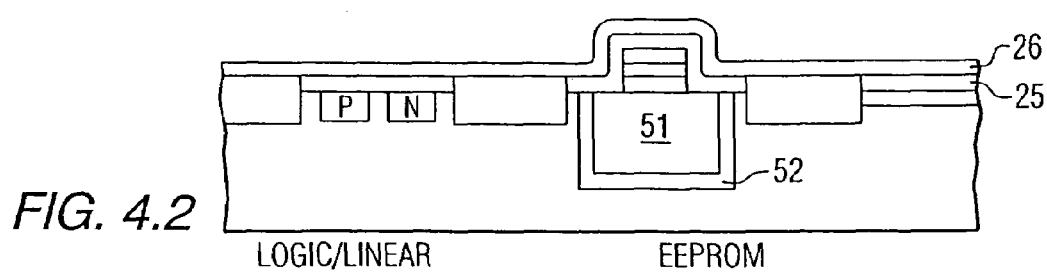
FIG. 4.2

FLASH MEMORY CELL AND THE METHOD OF MAKING SEPARATE SIDEWALL OXIDATION

CROSS-REFERENCE TO RELATED APPLICATIONS

This is a divisional application of U.S. utility patent application Ser. No. 10/234,344 filed Sep. 4, 2002 now U.S. Pat. No. 6,841,824.

BACKGROUND

Flash memory cells are often fabricated on the same substrate with logic or linear transistors. In order to have an efficient manufacturing process, the transistors for the control gate in the flash memory cells and the logic and linear transistors often share the same polysilicon mask. They also share the same sidewall oxidation process and the same reactive ion etch (RIE) of the gate. While the sharing of common steps is efficient, it also presents one or more technical problems. As features sizes shrink, logic and/or linear transistors require ultra shallow source and drain junction formation to avoid short channel effect (SCE). In order to achieve such ultra shallow source and drain junction formation the thermal budget for manufacturing the device must be kept very low. As such, sidewall oxidation process must be carried out at a low temperature or be entirely dispensed with. However, flash memory cell requires significant rounding of the gate edge to reduce the high electric fields that arise from the sharp gate edge, in order to retain charge in the gate stack. Gate rounding reduces leakage current by reducing the electric field around the charged trapped in the floating gate.

SUMMARY

The invention overcomes the problems of the prior art by optimizing sidewall oxidation processes and temperature for logic and linear transistors and for the flash memory transistor by using a dual hard mask (HM) approach. The logic and linear transistors are formed with one hard mask and the flash memory transistors are formed with another hard mask. A typical hard mask is formed from a chemical vapor deposited (CVD) TEOS (tetraethyl orthosilicade) oxide. While the additional TEOS hard mask adds several steps to the overall process, it avoids the expense of using an additional deep ultraviolet (DUV) mask to separate polysilicon for the control gate of the flash memory cells and the logic and linear transistors. The latter appears to be the only alternative for improving the existing, prior art process. More specifically, a second TEOS hard mask is added after the flash memory cell is etched. This occurs after removal of the first TEOS hard mask and formation of the flash sidewall oxide.

In order to practice the invention, the substrate is divided into a region including electrically erasable programmable memory EEPROM cells and other regions that include linear or logic devices. A triple well is formed in the EEPROM region. Then the gate stack is formed for the EEPROM transistor. This step includes forming a tunnel dielectric layer, a tunnel polysilicon gate layer, an interpoly dielectric layer and a control gate layer. The substrate is covered with a first hard mask, typically a TEOS layer. The TEOS layer is patterned and opened only in the EEPROM region to form source and drain regions for the EEPROM transistors. Those source and drain regions are implanted, the TEOS layer is removed, and the sidewalls are suitably oxidized for the EEPROM transistors. Thereafter, a second TEOS hard mask is deposited over the linear and logic regions. That TEOS hard mask is separately patterned to expose the source and drain regions for the linear and logic transistors. The linear and logic regions are implanted and the linear and logic transistors are completed in a manner well known in the art.

The invention allows the manufacturer to optimize the thickness of the sidewall insulating layer on the flash stack and the logic and/or linear stack. It enables manufacture of a device that has different sidewall dielectric thicknesses on the flash transistors and the logic and/or linear transistors. This structure overcomes the defects of prior art structures that have logic and/or linear and flash transistors with the same sidewall thickness. With the invention the logic and/or linear devices have thinner sidewall oxides and thus can be more closely spaced to provide added logic and/or linear circuitry on the substrate. In addition, the memory devices have thicker sidewall insulating layers that shield the charge stored in the interpoly dielectric layer from adversely influencing the operation of the memory transistor.

DESCRIPTION OF THE DRAWINGS

FIGS. 1–4.1 show initial key sequential steps in the process along the word line of the EEPROM region.

FIGS. 4.2–8 show final key sequential steps in the process along the bit line of the EEPROM region.

DETAILED DESCRIPTION

Figure 5:
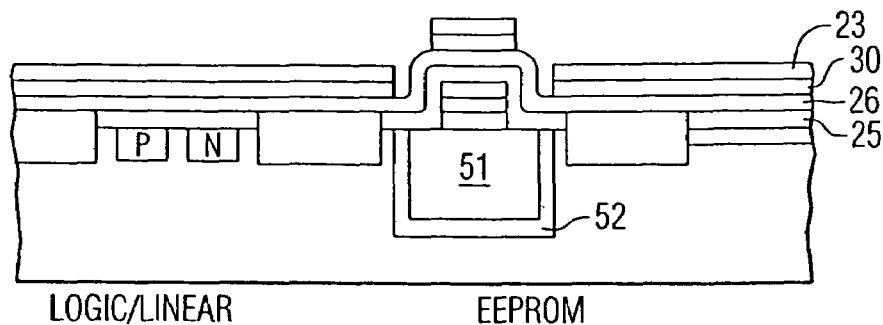
Figure 6:
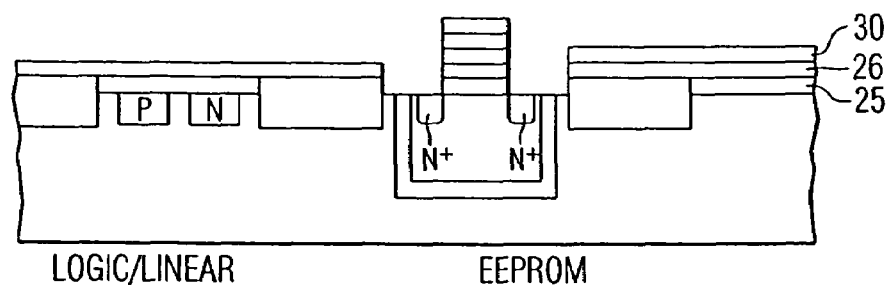
Figure 7:
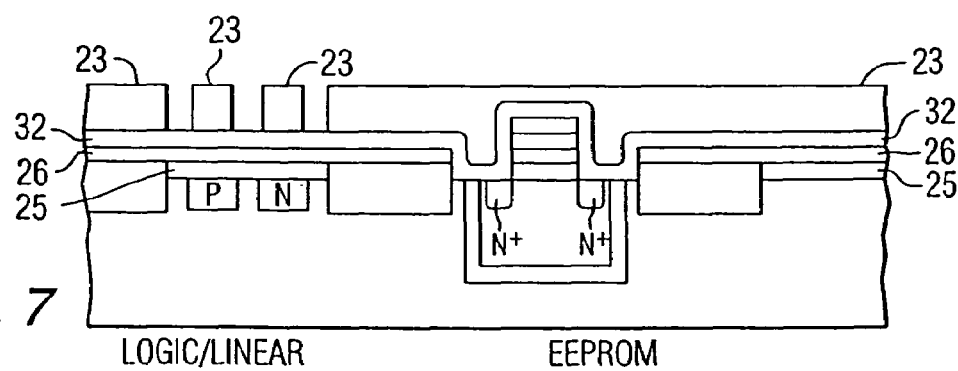
Figure 8:
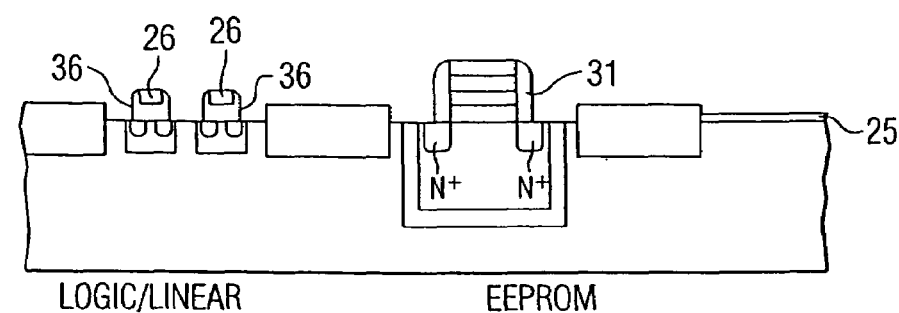

Turning to FIG. 1, a P-type substrate 18 is suitably patterned to form shallow trench isolation regions 20. The trench isolation regions 20 surround each EEPROM transistor and each pair of CMOS transistors. Those skilled in the art understand that the invention may be made on an N-type substrate where the dopings are suitable reversed. As shown in FIG. 2, the substrate is then covered with a floating gate oxide 21 followed by a layer 22 of polysilicon. Prior to deposition of the layers, a suitable portion of the substrate, such as portion A, is separately patterned and implanted to have a triple-well 50 comprising N-well 51 enclosed in a P-well 52 that resides in the P-type substrate 18. The drawing accompanying this description shows a logic CMOS pair of transistors in region B. Those regions may include transistor other than CMOS logic pairs. Those skilled in the art understand that transistor of one conductivity type may be formed in the B regions and types of transistors may be logic or linear, including and not limited to power transistors such as LDMOS transistors.

The oxide and polysilicon layers are then patterned with photoresist 23 to form a floating gate stack. Turning to FIG. 3, a layer 24 of oxinitride interpoly dielectric is deposited over the substrate. The layer 24 comprises sequentially deposited layers of low temperature deposited polysilicon that is oxidized and a layer of nitride rich silicon nitride. The layer 24 is suitably patterned by photoresist 23 to form two of the three layers of the ONO dielectric in the EEPROM stack as shown in FIG. 4. At this point, the layer 24 and polysilicon layer 11 are stripped from the peripheral regions B and they are suitably patterned and implanted to form P-wells 41 and N-wells 42.

Next, the substrate 18 is covered with a layer 25 of oxide followed by a second layer of polysilicon 26. The layer 25 forms the gate oxide layer for the logic and linear devices and forms the upper oxide layer of the ONO dielectric layer 24. The polysilicon layer 26 is provided for the control gates of the EEPROM transistors and the logic and linear transistors.

A first TEOS layer 30 is deposited over the second polysilicon layer 26. The first TEOS layer 30 is then suitably patterned with photoresist 23 to open the source and drain regions of the EEPROM. Source and drain regions are suitably implanted to form the source and drains of the EEPROM. After that, the first TEOS layer 30 is removed by a high selective reactive ion etching, stopping on polysilicon layer 26. Then the sidewalls of the gate stack of the EEPROM are oxidized to provide a sidewall oxide suitable for flash stack transistors. Oxidation takes place at about 850–950° centigrade in a furnace for approximately 30 minutes in order to grow a sidewall that is about 15 nanometers thick on the polysilicon regions of the gate stack. Thereafter, a second TEOS layer 32 is deposited over the substrate 18. TEOS layer 32 is suitably patterned with a photoresist layer 23 to form the gates and to open the source and drains of the logic and linear transistors.

The sources and drains of the logic and/or linear transistors are implanted, the second TEOS layer 32 is removed by reactive ion etching and the gates of the peripheral transistors receive a thinner sidewall oxide. That sidewall oxide is approximately 6 nanometers and is generated by a relatively short rapid thermal annealing step. The rapid thermal annealing is carried out at about 700–900° C. for about 10–20 second. It activates the doping in the logic and/or linear transistors but does not drive them very far into the substrate. This results in a logic and/or linear region with relatively closely spaced transistors.

As a result of the process described above a manufacturer may produce a single integrated circuit with logic and/or linear and memory devices having different sidewall insulating thicknesses. In the logic and/or linear region the sidewalls can be optimized to be as thin as needed to provide more transistor in the region allowed for logic and/or linear devices. In the memory region the memory devices are optimized to have a thick enough sidewall oxide to prevent the charge stored in the interpoly dielectric layer from having an unwanted effect on the operation of the memory transistors.

The invention claimed is:

1. A method for forming a flash EEPROM on a substrate with other linear or logic devices comprising the steps of:
    isolating an EEPROM region from a linear or device region(s);
    forming a triple well in the EEPROM region;
    forming an EEPROM gate stack including a tunnel dielectric layer, a tunnel gate layer, a control dielectric layer, and a control gate layer;
    covering the substrate with a first deposited hard mask layer;
    opening the first deposited oxide layer to expose EEPROM source and drain regions;
    implanting the exposed EEPROM source and drain regions;
    covering the substrate with a second deposited hard mask layer;
    opening the second deposited oxide layer to expose linear or logic source and drain region(s);
    implanting the exposed linear or logic source and drain regions;
    forming gate stacks for logic or linear devices; and
    forming dielectric layers on the sidewalls of said EEPROM gate stack and on the sidewalls of said gate stack for said logic or linear devices wherein said dielectric layers on said sidewalls of said EEPROM gate stack is thicker than the dielectric layers on the sidewalls of said logic or linear devices.

2. The method of claim 1 wherein the step of isolating the EEPROM region from the linear or device region(s) comprises forming shallow trenches between the EEPROM region and the other region(s) and filling the shallow trenches with a dielectric.

3. The method of claim 2 wherein the dielectric is silicon dioxide.

4. The method of claim 1 wherein the step of forming a triple well in the EEPROM region comprises providing a substrate lightly doped with one conductivity type impurity, covering the logic or linear regions with a mask layer and leaving areas of the EEPROM region exposed, and implanting the exposed EEPROM areas with two different conductivity type impurities.

5. The method of claim 1 wherein the step of forming an EEPROM gate stack includes depositing and patterning successive layers of tunnel dielectric, tunnel gate material, control gate dielectric, and control gate material.

6. The method of claim 5 wherein the tunnel dielectric is a layer of oxinitride.

7. The method of claim 5 wherein the tunnel gate and control gate are doped polysilicon.

8. The method of claim 1 wherein the first hard mask layer is formed from reacted TEOS.

9. The method of claim 1 wherein the second hard mask layer is formed from reacted TEOS.

10. The method of claim 1 wherein the further step of forming sidewall dielectric layers on the sidewalls of the EEPROM gate stack comprises rapid thermal oxidation.

11. A method for forming a flash EEPROM on a substrate with other linear or logic devices comprising the steps of:
    isolating an EEPROM region from a linear or device region(s);
    forming a triple well in the EEPROM region;
    forming an EEPROM gate stack including a tunnel dielectric layer, a tunnel gate layer, a control dielectric layer, and a control gate layer;
    covering the substrate with a first deposited hard mask layer;
    opening the first deposited oxide layer to expose EEPROM source and drain regions;
    implanting the exposed EEPROM source and drain regions;
    forming a dielectric layer on the sidewalls of said EEPROM gate stack;
    covering the substrate with a second deposited hard mask layer subsequent to forming said dielectric layer on the sidewalls of said EEPROM gate stack; and then;
    opening the second deposited oxide layer to expose linear or logic source and drain region(s); and
    implanting the exposed linear or logic source and drain regions;
    forming gate stacks for logic and linear devices; and
    forming a sidewall dielectric layer on the sidewalls of the logic or linear gate stack.

12. The method of claim 1 wherein the thickness of said dielectric sidewalls on said EEPROM gate stack is about 15 nm.

13. The method of claim 12 wherein the thickness of said dielectric sidewalls on said gate stacks of said logic or linear devices is about 6 nm.

14. The method of claim 11 wherein said EEPROM dielectric is thicker than the sidewall dielectric on the walls of the logic or linear gate stacks.

15. The method of claim 14 wherein the thickness of said dielectric sidewalls on said EEPROM gate stack is about 15 nm.

16. The method of claim 15 wherein the thickness of said dielectric sidewalls on said gate stacks of said logic or linear devices is about 6 nm.

* * * * *